US009082926B2

(12) United States Patent
Freund et al.

(10) Patent No.: US 9,082,926 B2
(45) Date of Patent: Jul. 14, 2015

(54) SEMICONDUCTOR OPTICAL EMITTING DEVICE WITH METALLIZED SIDEWALLS

(71) Applicant: LSI Corporation, San Jose, CA (US)

(72) Inventors: Joseph M. Freund, Fogelsville, PA (US); David L. Dreifus, Cary, NC (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 13/920,817

(22) Filed: Jun. 18, 2013

(65) Prior Publication Data

US 2014/0367717 A1    Dec. 18, 2014

(51) Int. Cl.
| H01L 33/00 | (2010.01) |
| H01L 33/24 | (2010.01) |
| H01L 33/12 | (2010.01) |
| H01L 33/46 | (2010.01) |
| H01L 33/20 | (2010.01) |

(52) U.S. Cl.
CPC ............... *H01L 33/24* (2013.01); *H01L 33/12* (2013.01); *H01L 33/20* (2013.01); *H01L 33/46* (2013.01)

(58) Field of Classification Search
None
See application file for complete search history.

(56) References Cited

U.S. PATENT DOCUMENTS

| 6,204,545 | B1 * | 3/2001 | Nakata ........................ 257/459 |
| 6,278,139 | B1 * | 8/2001 | Ishikawa et al. ............ 257/103 |
| 6,440,859 | B1 | 8/2002 | Peng et al. |
| 7,638,808 | B2 | 12/2009 | Owen et al. |
| 7,939,841 | B2 | 5/2011 | Lee et al. |
| 2005/0281303 | A1 * | 12/2005 | Horio et al. ................ 372/44.01 |
| 2006/0278886 | A1 | 12/2006 | Tomoda et al. |
| 2009/0050905 | A1 * | 2/2009 | Abu-Ageel ..................... 257/80 |
| 2009/0283787 | A1 | 11/2009 | Donofrio et al. |
| 2010/0283064 | A1 | 11/2010 | Samuelson et al. |
| 2011/0297914 | A1 | 12/2011 | Zheng et al. |
| 2012/0049214 | A1 | 3/2012 | Lowes et al. |
| 2013/0105978 | A1 | 5/2013 | Hung |

FOREIGN PATENT DOCUMENTS

| EP | 1677366 B1 | 2/2012 |
| EP | 2495761 A2 | 9/2012 |

OTHER PUBLICATIONS

N. Atthi et al., "Improvement of Photoresist Film Coverage on High Topology Surface with Spray Coating Technique," Journal of the Microscopy Society of Thailand, 2010, pp. 42-46, vol. 24, No. 1.

(Continued)

*Primary Examiner* — Bilkis Jahan
*Assistant Examiner* — Kevin Quinto
(74) *Attorney, Agent, or Firm* — Suiter Swantz pc llo

(57) ABSTRACT

A semiconductor optical emitting device comprises an at least partially transparent substrate, an active semiconductor structure, a dielectric layer and a metal layer. The substrate comprises a first surface, a second surface and at least one sidewall. The active semiconductor structure comprises a first surface, a second surface and at least one sidewall, the first surface of the active semiconductor structure facing the second surface of the substrate. The dielectric layer surrounds at least a portion of the at least one sidewall of the active semiconductor structure. The metal layer surrounds at least a portion of the dielectric layer. The at least one sidewall of the active semiconductor structure is tapered and a first portion of the at least one sidewall of the active semiconductor structure has a different tapering than a second portion of the at least one sidewall of the active semiconductor structure.

20 Claims, 12 Drawing Sheets

(56) References Cited

OTHER PUBLICATIONS

X.J. Chen et al., "Wafer-Scale Selective Area Growth of GaN Hexagonal Prismatic Nanostructures on C-Sapphire Substrate," Journal of Crystal Growth, May 2011, pp. 15-22, vol. 322, No. 1.

H.-S. Cheong et al., "Growth and Characteristics of Near-UV LED Structures on Wet-Etched Patterned Sapphire Substrate," Journal of Semiconductor Technology and Science, Sep. 2006, pp. 199-205, vol. 6, No. 3.

J. Chun et al., "Transfer of GaN LEDs from Sapphire to Flexible Substrates by Laser Lift-Off and Contact Printing," IEEE Photonics Technology Letters, Dec. 2012, pp. 2115-2118, vol. 24, No. 23.

K.A. Cooper et al., "Conformal Photoresist Coatings for High Aspect Ratio Features," IWLPC (Water Level Packaging) Conference Proceedings, Sep. 2007, 6 pages.

Victor David, "Slice and Dice: Laser Micromachining for Consumer Electronics," Industrial Laser Solutions, Application Report, Jul./Aug. 2010, pp. 9-12.

M. DeVre et al., "Advances in GaN Dry Etching Process Capabilities," Plasma-Therm Technical Paper, 2010, 5 pages.

M. Heschel et al., "Conformal Coating by Photoresist of Sharp Corners of Anisotropically Etched Through-Holes in Silicon," International Conference on Solid-State Sensors and Actuators, Transducers, Jun. 1997, pp. 209-212.

K.N. Hui et al., "Enhanced Light Output of Angled Sidewall Light-Emitting Diodes with Reflective Silver Films," Thin Solid Films, Feb. 2011, pp. 2504-2507, vol. 519, No. 8.

W. Kröninger et al., "Thinning and Singulation of Silicon: Root Causes of the Damage in Thin Chips," IEEE 56th Electronic Components and Technology Conference (ECTC), 2006, pp. 1317-1322.

C.W. Kuo et al., "Optical Simulation and Fabrication of Nitride-Based LEDs with the Inverted Pyramid Sidewalls," IEEE Journal of Selected Topics in Quantum Electronics, Jul./Aug. 2009, pp. 1264-1268, vol. 15, No. 4.

J. Lee et al., "GaN Light-Emitting Diode with Monolithically Integrated Photonic Crystals and Angled Sidewall Deflectors for Efficient Surface Emission," American Institute of Physics, Applied Physics Letters, Mar. 2009, pp. 101105-1-101105-3, vol. 94, No. 10.

J.-S. Lee et al., "GaN Light-Emitting Diode with Deep-Angled Mesa Sidewalls for Enhanced Light Emission in the Surface-Normal Direction," IEEE Transactions on Electron Devices, Feb. 2008, pp. 523-526, vol. 55, No. 2.

G.Y. Mak et al., "Precision Laser Micromachining of Trenches in GaN on Sapphire," American Vacuum Society, Journal of Vacuum Society Technology B, Mar./Apr. 2010, pp. 380-385, vol. 28, No. 2.

T. Nilsson et al., "Scribing of GaN Wafer for White LED by Water Jet Guided Laser," Proceedings of the SPIE, Jun. 2004, pp. 200-206, vol. 5366.

N.P. Pham et al., "Spray Coating of Photoresist for Pattern Transfer on High Topography Surfaces," Institute of Physics Publishing, Journal of Micromechanics and Microengineering, Apr. 2005, pp. 691-697, vol. 15, No. 4.

Y. Qin et al., "Atomic Layer Deposition Assisted Template Approach for Electrochemical Synthesis of Au Crescent-Shaped Half-Nanotubes," ACS Nano, Jan. 2011, pp. 788-794, vol. 5, No. 2.

C.H. Tsai et al., "Optimal Design of ITO/Organic Photonic Crystals in Polymer Light-Emitting Diodes with Sidewall Reflectors for High Efficiency," Microsystem Technologies, Sep. 2012, Technical Paper, pp. 1289-1296, vol. 18, No. 9-10.

X. Wang et al., "Laser Micromachining and Micro-Patterning with a Nanosecond UV Laser," Micromachining Techniques for Fabrication of Micro and Nanostructures, www.intechopen.com, Feb. 2012, pp. 85-108.

Z. Yiyun et al., "Light Extraction Efficiency Improvement by Curved GaN Sidewalls in InGaN-Based Light-Emitting Diodes," IEEE Photonics Technology Letters, Feb. 2012, pp. 243-245, vol. 24, No. 4.

K. Zandi et al., "New Photoresist Coating Method for High Topography Surfaces," IEEE 23rd International Conference on Micro Electro Mechanical Systems (MEMS), Jan. 2010, pp. 392-395.

Y. Zhu et al., "Enhanced Output of Flip-Chip Light-Emitting Diodes with a Sidewall Reflector," Solid-State Electronics, Feb. 2007, pp. 675-677, vol. 51, No. 5.

"5 Simple Shape Elements," Shape and Functional Elements of the Bulk Silicon Microtechnique: A Manual of Wet-Etched Silicon Structures, Chapter 5, Jan. 2005, 2 pages.

Nitto Denko, "Thermal Release Tape," Semiconductor Equipment Corporation, REVALPHA, 2011, 1 page.

Kulicke & Soffa, "Dicing Products—Hub Blades and Services for Advanced Material Applications," Product Brochure, 2007, 24 pages.

Yole Développement, "LED Manufacturing Technologies & Costs," DOE Workshop, Apr. 2009, 32 pages.

"Output from Vertical Nitride LEDs Boosted by 21%," http://www.semiconductor-today.com/news_items/2010/JULY/KOREALED_250710.html, Jul. 2010, 4 pages.

Delphilaser, "Offer Custom Laser Processing Solutions," Suzhou Delphi Laser Co., Ltd., 2010, 15 pages.

SPTS Technologies, "Etch," http://www.spts.com/markets/led-manufacturing/etch, Accessed Jun. 18, 2013, 4 pages.

* cited by examiner

US 9,082,926 B2

SEMICONDUCTOR OPTICAL EMITTING DEVICE WITH METALLIZED SIDEWALLS

FIELD

The field relates generally to semiconductor devices, and more particularly to semiconductor optical emitting devices.

BACKGROUND

Many different types of semiconductor optical emitting devices are known in the art, including surface emitting lasers and light emitting diodes. Some of these devices utilize gallium nitride (GaN) to form an active semiconductor structure for light generation. Surface emitting lasers and light emitting diodes based on GaN have come into widespread use in numerous applications, including traffic lights and other types of solid-state lighting, indoor and outdoor electronic displays, backlighting for liquid crystal displays, and many others. These GaN-based devices have a number of significant advantages, such as good optical beam characteristics and ease of batch fabrication and packaging. Other types of semiconductor optical emitting devices provide similar advantages using other semiconductor materials.

SUMMARY

In one embodiment, a semiconductor optical emitting device comprises an at least partially transparent substrate, an active semiconductor structure, a dielectric layer and a metal layer. The substrate comprises a first surface, a second surface and at least one sidewall. The active semiconductor structure comprises a first surface, a second surface and at least one sidewall, the first surface of the active semiconductor structure facing the second surface of the substrate. The dielectric layer surrounds at least a portion of the at least one sidewall of the active semiconductor structure. The metal layer surrounds at least a portion of the dielectric layer. The at least one sidewall of the active semiconductor structure is tapered and a first portion of the at least one sidewall of the active semiconductor structure has a different tapering than a second portion of the at least one sidewall of the active semiconductor structure.

The semiconductor optical emitting device may be implemented in the form of a surface emitting laser or a light emitting diode, or in other forms.

One or more surface emitting lasers, light emitting diodes or other semiconductor optical emitting devices may be implemented with associated control circuitry in a lighting system, an electronic display or another type of system or device. As a more particular example, multiple semiconductor optical emitting devices may be combined in the form of an array having associated control circuitry and implemented in a lighting system, an electronic display or another type of system or device.

Other embodiments of the invention include but are not limited to methods, apparatus, integrated circuits and processing devices.

DETAILED DESCRIPTION

Embodiments of the invention will be illustrated herein in conjunction with exemplary light emitting diodes (LEDs). It should be understood, however, that embodiments of the invention can be implemented using a wide variety of alternative types and configurations of semiconductor optical emitting devices, including, for example, surface emitting lasers (SELs).

Figure 1:
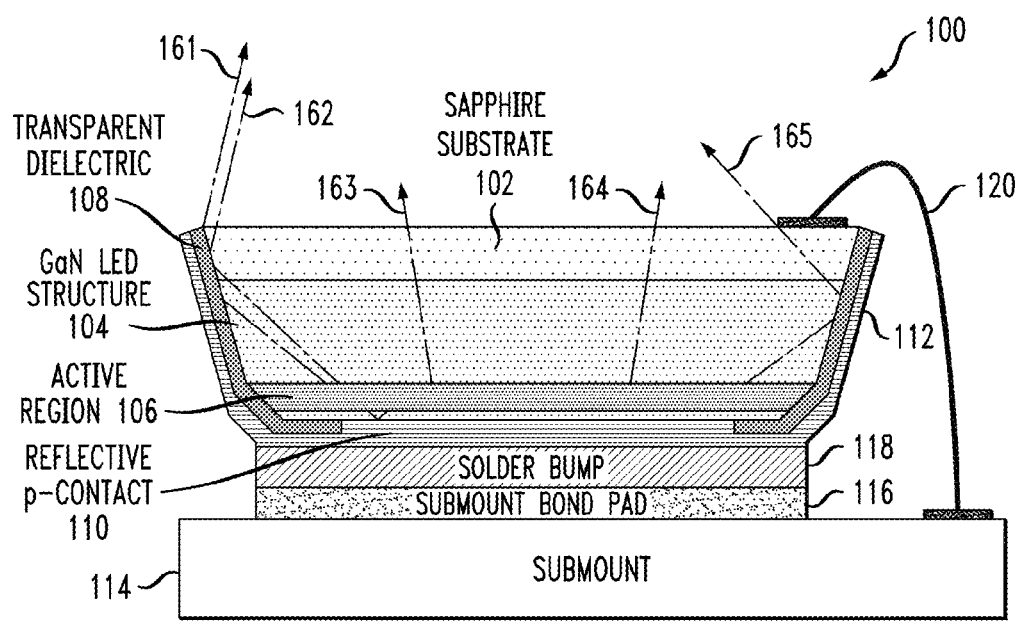
FIG. 1 is a cross-sectional view of an exemplary semiconductor optical emitting device comprising a light emitting diode having metallized sidewalls in an illustrative embodiment.

FIG. 1 shows an exemplary semiconductor optical emitting device in the form of an LED 100. The LED 100 comprises a sapphire substrate 102 and an active semiconductor structure 104. As shown in FIG. 1, a surface of the active semiconductor structure 104 faces a surface of the sapphire substrate 102. In the view of FIG. 1, the surface of the active semiconductor structure 104 which faces the substrate 102 is referred to herein as a top or first surface. In the view of FIG. 1, the surface of the substrate 102 facing the first surface of the active semiconductor structure 104 is referred to herein as a bottom or second surface.

The active semiconductor structure 104 in this embodiment illustratively comprises a GaN LED structure, but numerous other semiconductor materials and configurations can be used in other embodiments. The GaN LED structure may be epitaxially grown or otherwise formed on the sapphire substrate using well-known techniques.

The sapphire substrate 102 is substantially transparent at one or more wavelengths of the light generated by the active semiconductor structure 104, and is an example of what is more generally referred to herein as an "at least partially transparent substrate." Such a substrate may be substantially transparent for a particular range of wavelengths that encompass typical wavelengths of light generated by the active semiconductor structure 104. A wide variety of different types of substrates may be used in other embodiments. Accordingly, use of a sapphire substrate is not required.

A dielectric layer 108 is formed surrounding the sidewalls of the substrate 102, the sidewalls of the active semiconductor structure 104, and a portion of the bottom or second surface of the active semiconductor structure 104. A remainder of the bottom or second surface of the active semiconductor structure 104 which is not surrounded by the dielectric layer 108 may form an area for p-contact 110. A metal layer 112 surrounds the dielectric layer 108.

Light is generated in the LED 100 via an active region 106 of the active semiconductor structure 104, although numerous other light generation arrangements may be used in other embodiments. At least a portion of the light generated by the active semiconductor structure 104 is emitted through the substrate 102 from the bottom or second surface of the substrate to the top or first surface of the substrate 102. For example, portions of the light emitted from the active semiconductor structure 104 may be emitted along light paths 163 and 164 through the bottom or second surface of the substrate 102 and out the top or first surface of the substrate 102. Other portions of the light generated from the active semiconductor structure 104 may be emitted along light paths 161, 162 and 165 towards sidewalls of either the active semiconductor structure 104 or the substrate 102.

The sidewalls of the active semiconductor structure 104 and the substrate 102 may be tapered such that light emitted from the active semiconductor structure 104 towards sidewalls of either the active semiconductor structure 104 or substrate 102 is reflected away from the sidewalls and towards the top or first surface of the substrate 102. The sidewalls of the active semiconductor structure 104 may be tapered inwardly from the first or top surface of the active semiconductor structure as shown in FIG. 1.

The dielectric layer 108 may be at least partially transparent at one or more wavelengths of light generated by the active semiconductor structure 104. The dielectric layer may also or alternatively comprise a passivating, anti-reflective dielectric. The dielectric layer can further be configured so as to prevent surface absorption of light generated by the active semiconductor structure 104. The dielectric layer 108 may comprise $SiO_2$, although various other materials may be used. The metal layer 112 surrounding the dielectric layer 108 may comprise aluminum, gold, silver, platinum, titanium or various other metals and alloys.

As shown in FIG. 1, light generated from the active semiconductor structure 104 emitted along light paths 161, 162 and 165 passes through the dielectric layer 108 to the metal layer 112 and reflects back through the active semiconductor structure 104 and/or substrate 102 towards the top or first surface of the substrate 102.

As shown in FIG. 1, sidewalls of the substrate 102 and active semiconductor structure 104 are tapered so as to reflect light generated in the active semiconductor structure 104 in a desired direction. In FIG. 1, the desired or primary direction for light is out through the top or first surface of the substrate 102. It is to be appreciated, however, that various other desired directions may be selected for a particular embodiment. In addition, an amount of tapering or a tapering profile of at least one sidewall of the active semiconductor structure 104 may be selected to achieve desired reflective properties.

In FIG. 1, sidewalls of the substrate 102 are tapered inwardly from the top or first surface of the substrate 102. Similarly, sidewalls of the active semiconductor structure 104 are tapered inwardly from the top or first surface of the active semiconductor structure 104. It is important to note that while FIG. 1 shows the entire length of the sidewalls of the substrate 102 and active semiconductor structure 104 being tapered, embodiments are not limited solely to this arrangement. In some embodiments, a portion of the sidewalls of the substrate 102 and/or active semiconductor structure 104 may be substantially perpendicular to the top or first surface of the substrate 102 and/or the top or first surface of the active semiconductor structure 104. In other embodiments, the substrate may not be tapered at all.

As shown in FIG. 1, portions of the sidewalls of the active semiconductor structure 104 have different tapering. A given portion of the sidewalls of the active semiconductor structure 104 extending from the active region 106 to the bottom or second surface of the active semiconductor structure 104 has a different tapering than a remainder of the sidewalls of the active semiconductor structure 104. It is important to note, however, that the given portion need not extend from the active region 106 to the bottom or second surface of the active semiconductor structure 104. Instead, for example, the given portion may comprise a portion of the sidewalls of the active semiconductor structure 104 proximate the bottom or second surface of the active semiconductor structure 104 which does not include sidewalls surrounding the active region 106 or includes only portions of the sidewalls surrounding the active region 106.

The tapering of at least one sidewall of the active semiconductor structure 104 may be chosen to reduce stress points at corners or edges of the active semiconductor structure 104 where the bottom surface of the active semiconductor structure 104 meets at least one sidewall of the active semiconductor structure 104. In some embodiments, the active semiconductor structure is formed such that the active region strip 106 is only a few micrometers from the bottom or second surface of the semiconductor structure 104. Thus, stress points at the corners or edges of the active semiconductor structure 104 which cause cracking or other discontinuities in the dielectric layer 108 may short the LED 100 by contacting the metal layer 112 to the active region 106. Semiconductor optical emitting devices in embodiments of the invention may have portions of sidewalls with varying tapering so as to reduce these stress points. In addition, various other portions of sidewalls of the active semiconductor structure 104 may be tapered so as to reduce other stress concentration areas.

The active region 106 may also be isolated using a variety of techniques, including selective etching or laser dicing, ion milling, and/or selective area growth techniques. These techniques can allow for better control of the tapering for sidewalls of the active semiconductor structure and prevent damage such as shorting.

The tapering of the sidewalls of the active semiconductor structure 104 may be described in terms of a slope defined with respect to an x-axis substantially parallel to the bottom or second surface of the active semiconductor structure 104 and a y-axis which is perpendicular to the x-axis. The slope, i.e., $\Delta y/\Delta x$, of the given portion of the sidewalls of the active semiconductor structure 104 extending from the active region 106 to the bottom or second surface of the active semiconductor structure 104 has a magnitude which is less than that of the remainder of the sidewalls. Thus, the angle of the corner of the sidewalls and the bottom surface of the active semiconductor structure 104 is more obtuse than an angle of the remainder of the sidewalls of the active semiconductor structure 104 with respect to the bottom surface of the active semiconductor structure 104.

It is to be appreciated that the given portion of the sidewalls of the active semiconductor structure 104 need not have a uniform or constant slope. Instead, the given portion of the sidewalls of the active semiconductor structure 104 may comprise one or more linear segments of varying slopes. The given portion of the sidewalls of the active semiconductor structure 104 may also be curved such that they form a rounded edge with the bottom surface of the active semiconductor structure 104. Various other tapering profiles and arrangements may be utilized for portions of sidewalls of the active semiconductor structure 104 in other embodiments.

The LED 100 further comprises a submount 114 configured to support the active semiconductor structure 104 and its associated substrate 102. Part of an upper surface of the submount 114 underlies the active region 106 of the active semiconductor structure 102. This arrangement of active semiconductor structure 102, substrate 104 and submount 114 is an example of a flip-chip configuration of an LED. Although such flip-chip configurations can provide enhanced thermal management and optical coupling of light emission, other types and arrangements of semiconductor optical emitting device packaging can be used.

As indicated above, the submount 114 supports the active semiconductor structure 104 and the substrate 102. A submount bond pad 116 and solder bump 118 are formed on an upper surface of the submount 114 for coupling to a p-contact 110 on a bottom or second surface of the active semiconductor structure 104. The p-contact 110 may be formed integrally with or otherwise associated with a reflector of the active semiconductor structure 104.

The above-noted reflector is generally arranged to reflect light generated in the active region 106 away from the bottom or second surface of the active semiconductor structure 104 and back toward the substrate 102.

An n-contact 120 is also formed for connecting to a first or top surface of the substrate 102. At least one via is provided in the substrate 102 for connecting the n-contact 120 to the active semiconductor structure 104.

Again, the LED 100 is exemplary only, and other types of LED structures or more generally semiconductor optical emitting devices may be used. For example, as indicated previously, the particular LED structure used as the active semiconductor structure 104 in FIG. 1 could be replaced in other embodiments with other types of LED structures as well as SEL structures.

Formation of the LED 100 will now be described with respect to FIGS. 2-11.

Figure 2:
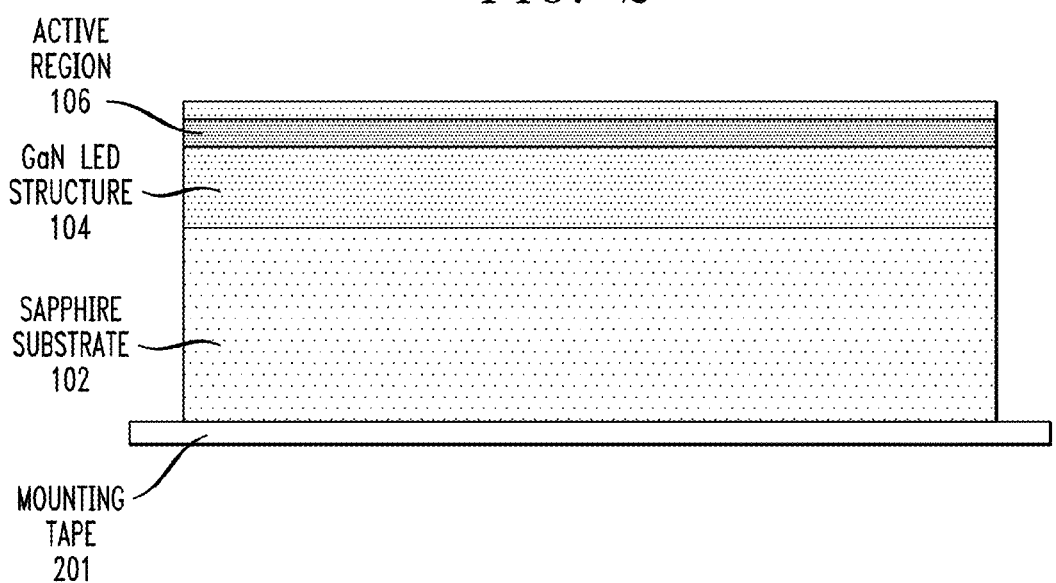
FIGS. 2 through 11 illustrate respective steps in a process of forming the light emitting diode of FIG. 1.

FIG. 2 shows active semiconductor structure 104 with the first surface facing a second surface of the sapphire substrate 102. The first surface of the active semiconductor structure 104 corresponds to the top surface of the active semiconductor structure 104 as shown in FIG. 1, and the second surface of the substrate 102 corresponds to the bottom surface of the substrate 102 as shown in FIG. 1.

The sapphire substrate 102 has a particular initial thickness, which may be by way of example approximately 400 micrometers (μm). It is assumed that the GaN LED structure is formed by growing multiple GaN layers epitaxially on the sapphire substrate using metal organic vapor deposition (MOCVD). Similar techniques may be used to form other types of active semiconductor structures, such as LED structures. The active semiconductor structure 104 has an active region stripe 106 formed therein.

Mounting tape 201 is attached to the first surface of the substrate 102 for further processing steps in forming the LED 100. A variety of films and other materials may be used for the mounting tape 201. The particular film or adhesive material chosen may depend on a number of factors, including by way of example the adhesive strength required for subsequent processing steps, such as grinding the substrate 102 to a desired thickness, and the ease of picking up, placing and releasing the structure for bonding into a package. In some embodiments, UV-tape or thermal release tape is used. UV-tape and thermal release tape provide sufficient adhesive strength for sawing and grinding processes while also providing a repeatable and low release strength for picking up, placing and releasing the structure.

Figure 3:
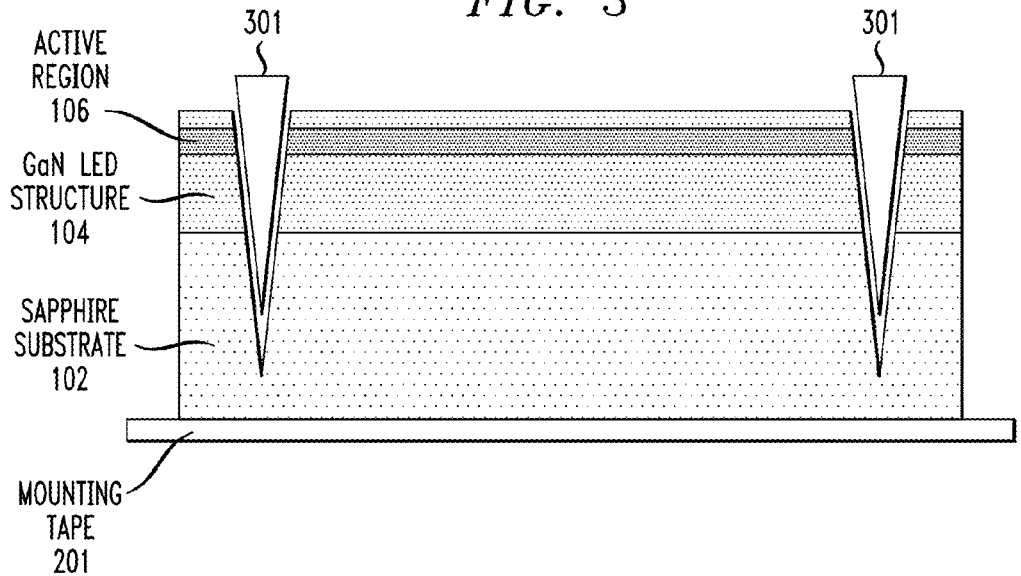

Next, the structure is pre-sawed to a predetermined depth using beveled diamond blades 301 as shown in FIG. 3. The pre-saw procedure establishes individual die size, die thickness, and portions of the tapering of sidewalls of the active semiconductor structure 104 and the substrate 102. The size and shape of the beveled diamond blades 301 may be chosen based on a desired tapering of portions of the sidewalls of the active semiconductor structure 104 and the substrate 102.

Various other processing techniques may be used to establish the individual die size, die thickness and tapering of portions of the active semiconductor structure 104 and the substrate 102. For example, laser dicing, ion milling or other micromachining technique may be utilized in place of or in combination with the beveled diamond blades 301.

In some embodiments, an etch mask layer may be formed on a second surface of the active semiconductor structure 104. The etch mask layer can be coated with photoresist and patterned to expose areas of the mask to be removed. Subsequently, the etch mask material can etched and the photoresist removed using reactive ion etching (RIE) or wet etching to expose portions of the second surface of the active semiconductor structure and leave a patterned mask. The exposed portions of the second surface of the active semiconductor structure can then be etched to achieve a desired tapering of sidewalls of the active semiconductor structure and/or the substrate.

In other embodiments, an active semiconductor structure may be grown on a portion of a substrate exposed using a growth mask. Selected area growth techniques may be utilized for forming the active semiconductor structure with a desired tapering for its sidewalls. One skilled in the art will readily appreciate that various other processes may be utilized.

Figure 4:
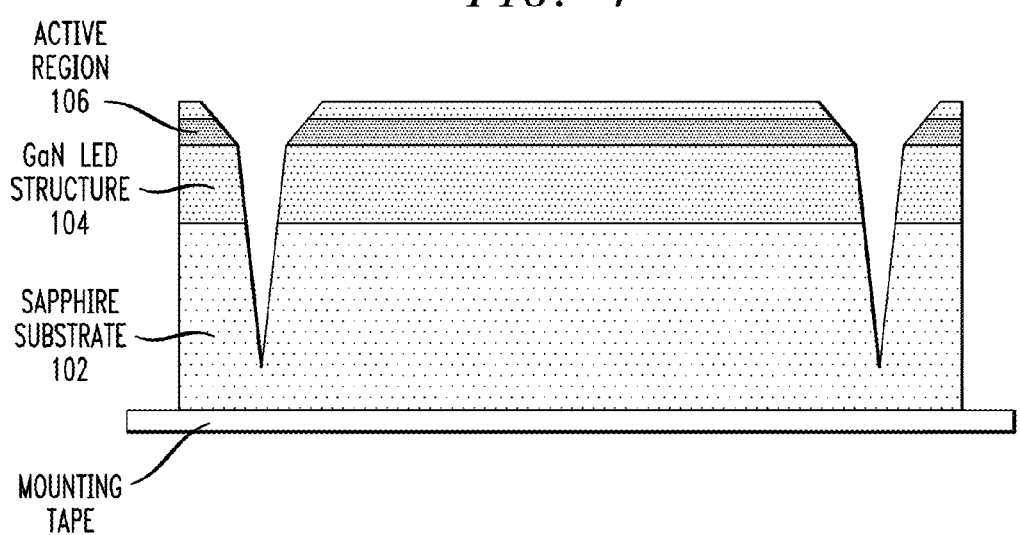

FIG. 4 shows a post-processing etch formed on portions of the active semiconductor structure 104. The post-processing etch can be used to provide rounded edges where the second surface of the active semiconductor structure 104 meets the sidewalls of the active semiconductor structure. The post-processing etch, as described above, can advantageously shape or form portions of the sidewalls of the active semiconductor structure 104 with a different tapering so as to reduce stress points along edges where the sidewalls of the active semiconductor structure 104 meet the bottom surface of the active semiconductor structure 104. As noted above, stress points on the sidewalls may lead to cracking of the passivation or dielectric layer 108. In some embodiments, the active region 106 is within a few micrometers of the second surface of the active semiconductor structure 104, and thus the structure may be susceptible to shorts that can occur due to cracks in the passivation or dielectric layer along edges where the sidewalls of the active semiconductor structure 104 meet the bottom surface of the active semiconductor structure.

Figure 5:
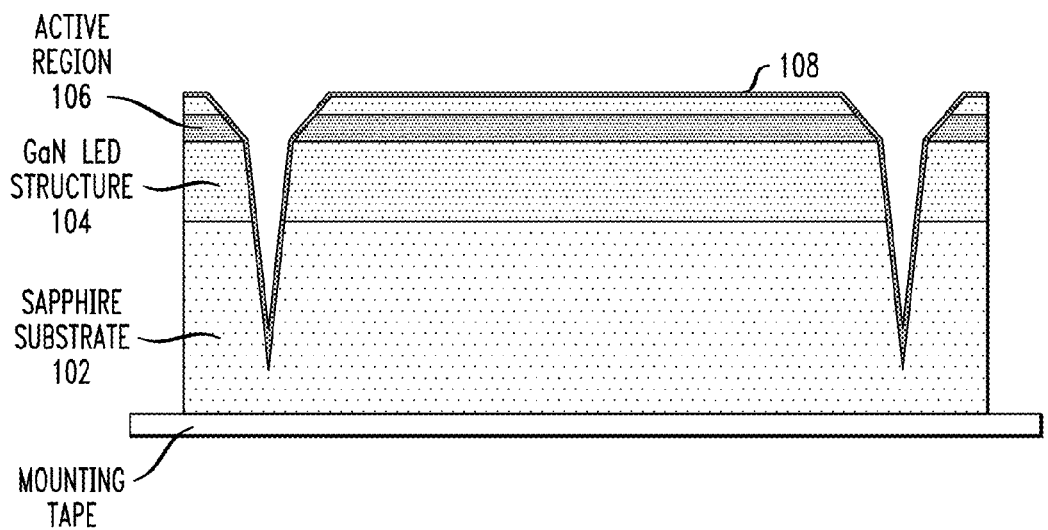

Dielectric layer 108 is then formed as shown in FIG. 5. The dielectric layer 108 is formed on the second surface of the active semiconductor structure 104 and the sidewalls of the active semiconductor structure 104 and substrate 102 exposed by the pre-saw and post-processing etch processes illustrated in FIGS. 3 and 4. The dielectric layer 108 may be deposited using atomic layer deposition (ALD). The dielectric layer 108 may alternatively be deposited using a number of other techniques, including by way of example, plasma-enhanced chemical vapor deposition (PECVD). The dielectric layer 108 may be approximately 1.0 to 2.0 μm thick and formed from silicon dioxide ($SiO_2$), although other thicknesses and materials could be used. Embodiments which utilize this thin dielectric layer 108 of approximately 1.0 to 2.0 μm can provide enhanced reflection. For a thin dielectric layer 108, light emitted from the active semiconductor structure 104 does not need to travel as far before being reflected towards the top surface of the substrate 102 by the metal layer 112.

Figure 6:
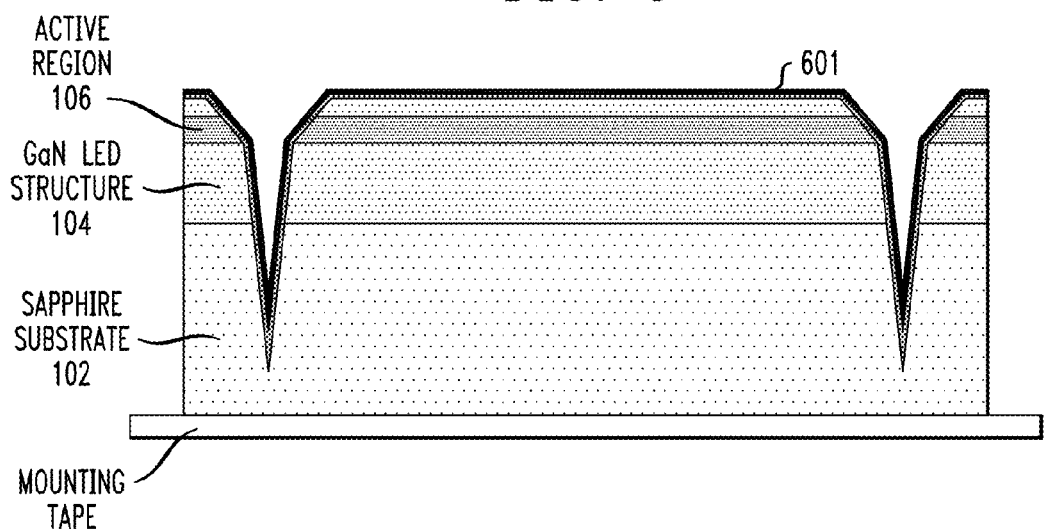
Figure 7:
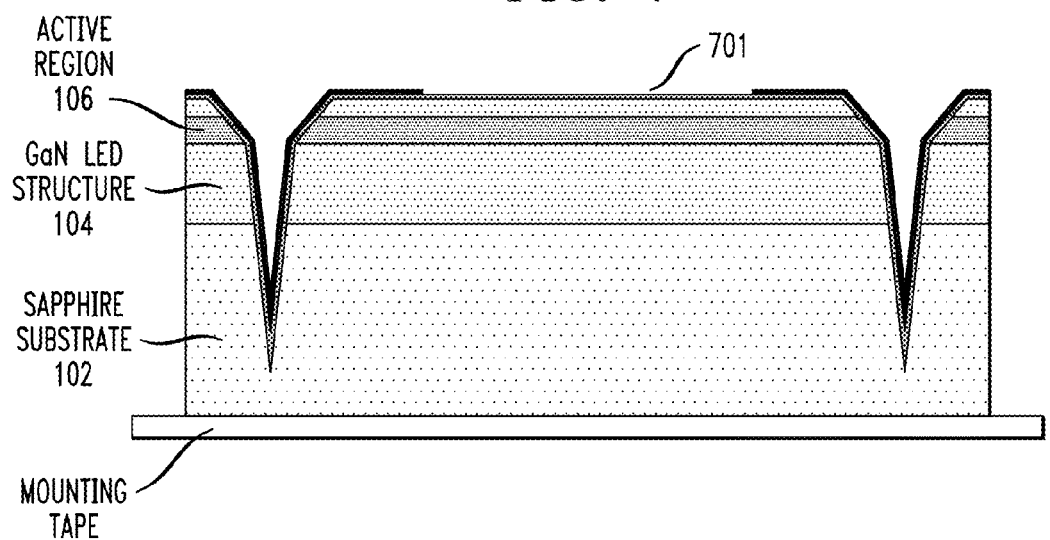
Figure 8:
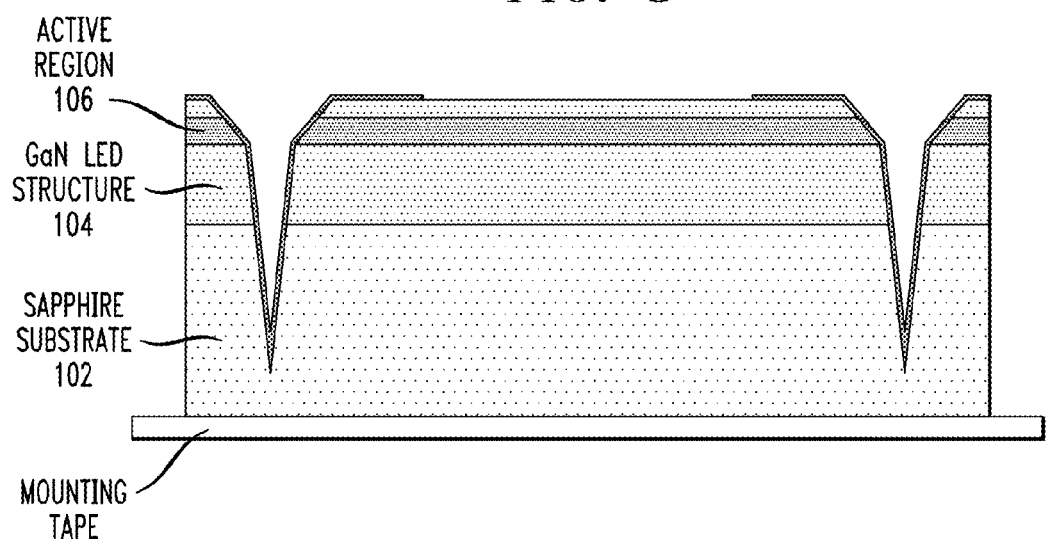

A conformal photoresist layer 601 is then formed over the dielectric layer 108 as shown in FIG. 6. The photoresist layer 601 may be deposited using spray coating techniques, although various other techniques may be used. Next, the photoresist layer 601 is exposed and patterned to form an opening 701 as shown in FIG. 7. This may involve, for example, etching the dielectric layer 108 into stripe masks using wet etching techniques, such as a buffer-oxide-etch (BOE) process. The p-contact 110 is later formed in the opening 701. RIE or wet etching is used to remove the remaining photoresist layer 601 and the portion of the dielectric layer 108 exposed by opening 701 as shown in FIG. 8.

Figure 9:
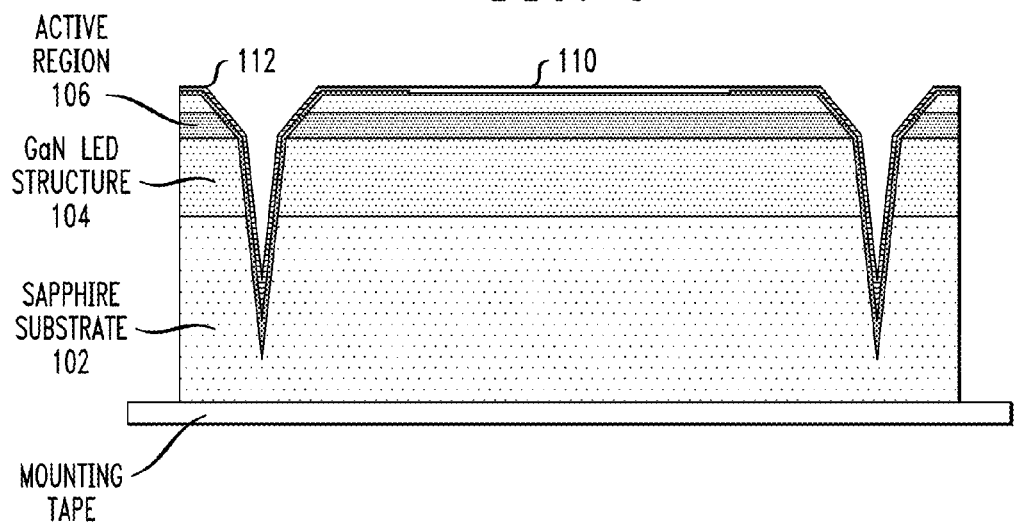

A conformal layer of reflective metallization is then deposited on the dielectric layer 108 and the portion of the active semiconductor structure 104 exposed by opening 701 as shown in FIG. 9. The conformal layer of reflective metallization forms the p-contact 110 and the metal layer 112. The conformal layer of reflective metallization may be deposited using ALD, although other suitable techniques may also be used.

Figure 10:
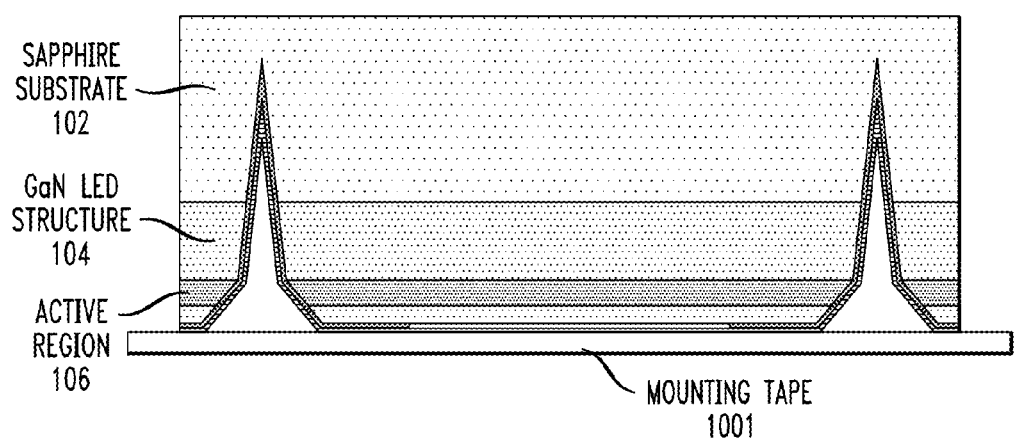

A tape-to-tape transfer is then performed as shown in FIG. 10 to expose the first surface of the substrate 102. Mounting tape 201 is removed from the first surface of the substrate 102 and mounting tape 1001 is placed to protect the p-contact 110, the metal layer 112 and the topography of the structure.

Figure 11:
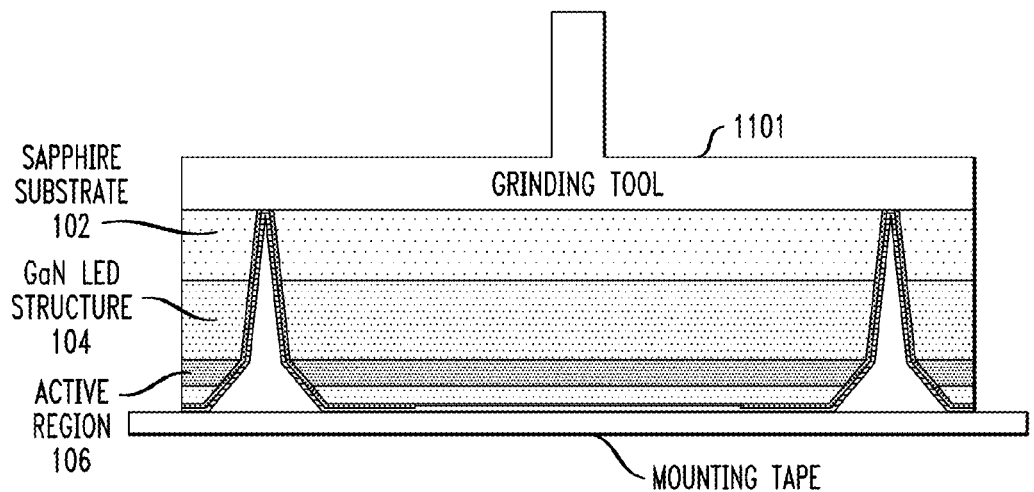

A backside grind is performed as shown in FIG. 11 to separate the wafer into individual die. A grinding tool 1101 is used to grind the substrate 102 down to a desired thickness. As described above, the initial thickness of the substrate 102 may be 400 μm, and the substrate 102 may be ground down to approximately 200 μm.

Although the desired thickness in this example is approximately 200 μm, numerous other thicknesses may be used. It should therefore be appreciated that thicknesses and other dimensions referred to herein are exemplary only. The thickness of the substrate 102 may be selected based on the tapering of sidewalls of the substrate 102 and/or the tapering of sidewalls of the active semiconductor structure 104 for desired reflective properties in a particular application. The desired thickness may also be selected to reduce the mean free path and improve light extraction from the active region 106 of active semiconductor structure 104. Also, a GaN buffer layer of the active semiconductor structure 102 may be used as an etch stop to provide additional reduction in the mean free path.

Once the wafer is separated into individual die as shown in FIG. 11, the die can be picked up and placed such that the p-contact 110 and metal layer 112 are mounted on the solder bump 118 as shown in FIG. 1. Photolithography and wet etching processes can be used to define the solder bump 118 pattern. The solder bump 118 may comprise tin (Sn) which is electroplated onto the p-contact 110.

In some embodiments, the grinding process may completely remove the substrate 102 by grinding down to the active semiconductor structure 104 to separate the wafer into individual die. An individual die can be picked up and placed from the mounting tape directly for bonding to a submount. Thus, it is to be appreciated that in some embodiments an LED is formed similar to the LED 100 shown in FIG. 1 without the substrate 102.

In other embodiments, a laser lift-off technique may be utilized instead of grinding down the substrate 102 and/or active semiconductor structure 104. In a laser lift-off technique, the second surface of the substrate 102 is illuminated by a laser. Sacrificial layers in the active semiconductor structure 104 can delaminate from the substrate 102, or some amount of the Gallium (Ga) in the active semiconductor structure 104 can liquefy causing the active semiconductor structure 104 to delaminate from the substrate 102.

The above-described process operations are assumed to be performed at the wafer level, and the processed wafer is then separated into individual integrated circuits. A given one of the integrated circuits is arranged into a flip-chip package by bonding to the submount 114 as previously described.

It is important to note that embodiments of the invention are not limited solely to separating the wafer into individual die as shown in FIG. 11. Instead, as will be described in further detail below, a number of die of the wafer may be grouped into an array, where the metal layer is formed around sidewalls of the array of die on the wafer.

Figure 12:
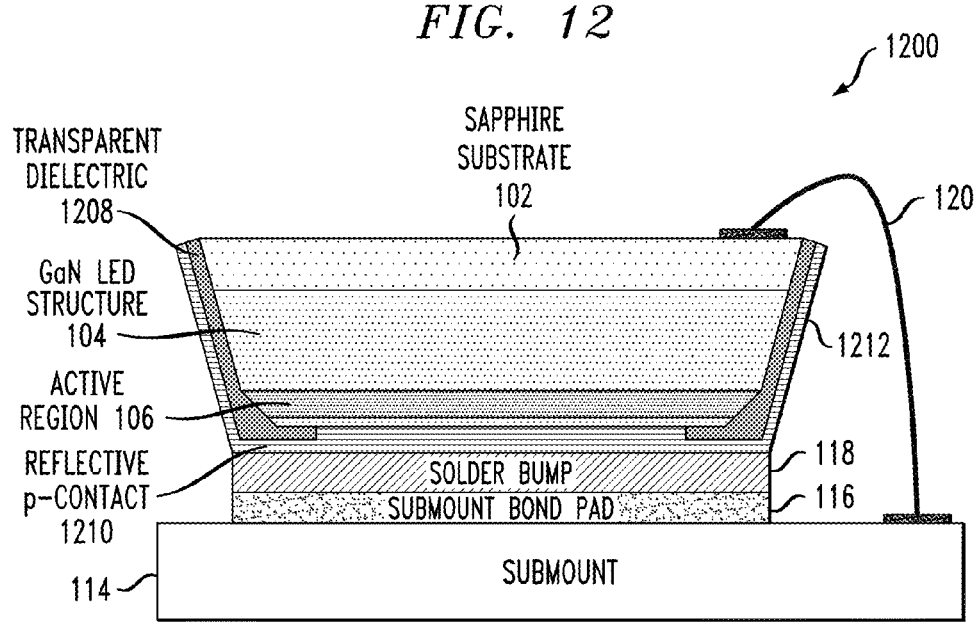
FIGS. 12 and 13 are cross-sectional views of different possible configurations for a light emitting diode in illustrative embodiments.
Figure 13:
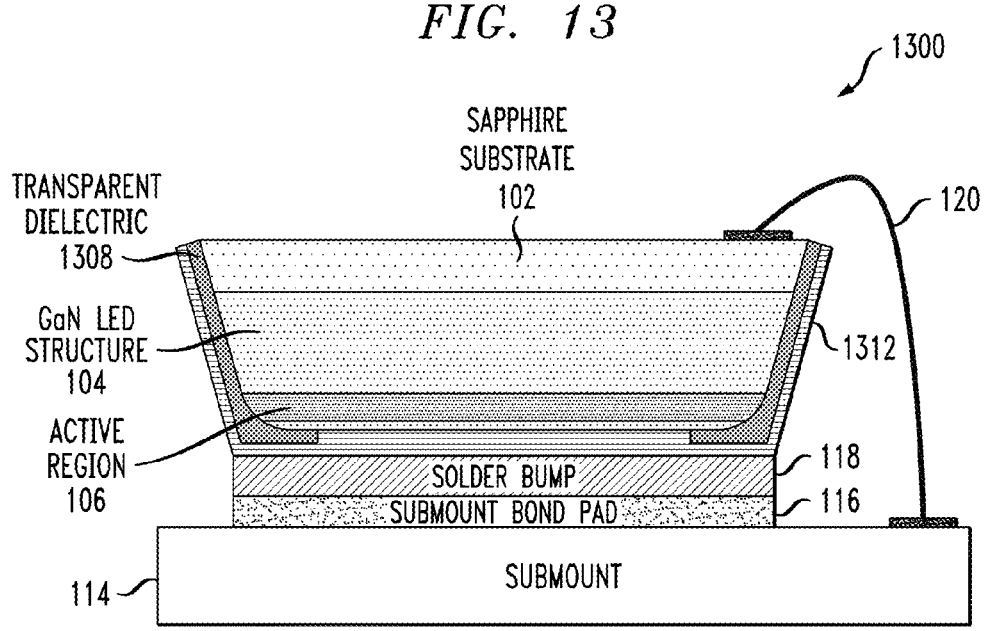

FIGS. 12 and 13 show cross-sectional views of different possible configurations for the sidewalls of active semiconductor structure 104, dielectric layer 108 and metal layer 112 shown in LED 100 of FIG. 1. Like reference numerals in FIGS. 12 and 13 refer to similar elements in FIG. 1.

FIG. 12 shows an LED 1200 where the dielectric layer 1208 surrounding the sidewalls of the substrate 102, the sidewalls of the active semiconductor structure 104 and a portion of the bottom surface of the active semiconductor structure 104 has a non-uniform thickness. As discussed above, edges where the sidewalls of the active semiconductor structure 104 meet the bottom or second surface of the active semiconductor structure 104 can form a stress point. Cracking of the dielectric layer 1208 at this stress point can cause the metal layer 1212 to short the LED 1200. As shown in FIG. 12, the dielectric layer 1208 at this stress point is thicker than the dielectric layer 1208 on a remainder of the sidewalls of the active semiconductor structure 104 to help avoid shorting the LED 1200. By way of example, the dielectric layer 108 at this stress point may be twice as thick as a remainder of the dielectric layer 108 although various other thickness configurations may be utilized. As further examples, the ratio of the thickness of the dielectric layer 108 at stress points relative to a remainder of the sidewalls may be 3:2 or 3:1.

FIG. 13 shows an LED 1300 where the tapering of a given portion of the sidewalls of the active semiconductor structure 104 is shaped so as to form a rounded edge with respect to the bottom surface of the active semiconductor structure 104. As shown in FIG. 13, the dielectric layer 1308 at this edge is rounded, reducing the severity of the stress point at edges where the sidewalls of the active semiconductor structure 104 meet the bottom surface of the active semiconductor structure 104, thus helping to prevent the metal layer 1312 from shorting the LED 1300. In addition to having a rounded edge, the LED 1300 may also have a thicker dielectric layer at stress points as described above with respect to the LED 1200.

As described above, in some embodiments the wafer is not physically separated into die which are individually packaged. FIGS. 14-19 illustrate respective steps in a process of forming an array of semiconductor optical emitting devices in these embodiments.

Figure 14:
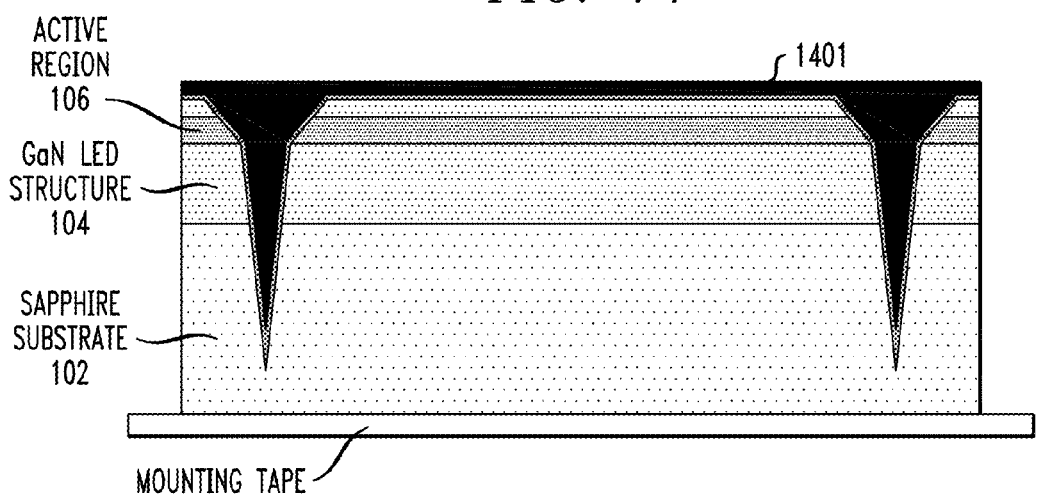
FIGS. 14-19 illustrate respective steps in a process of forming an array of light emitting diodes in an illustrative embodiment.

FIG. 14 shows a cross-sectional view of the structure of FIG. 5 with a planarizing layer of dielectric 1401 formed over the dielectric layer 108. The planarizing dielectric layer 1401 may be deposited using ALD, though a number of other techniques may be utilized as described above. It is to be appreciated that although the planarizing dielectric layer 1401 is shown in FIG. 14 as being deposited on the dielectric layer separating three individual die, embodiments are not limited to this arrangement. Instead, the planarizing dielectric layer 1401 may be formed on a wafer with two individual die or more than three individual die.

Figure 15:
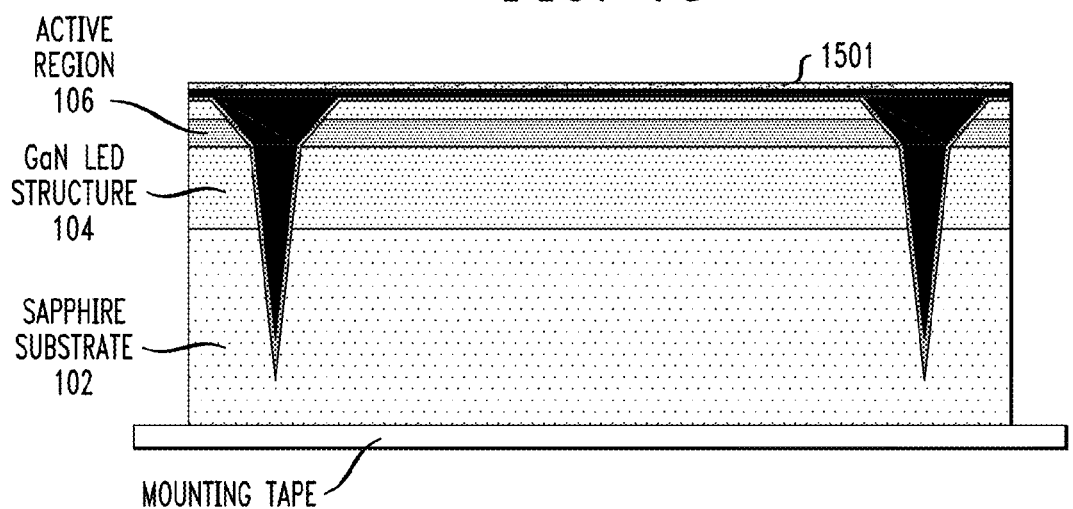
Figure 16:
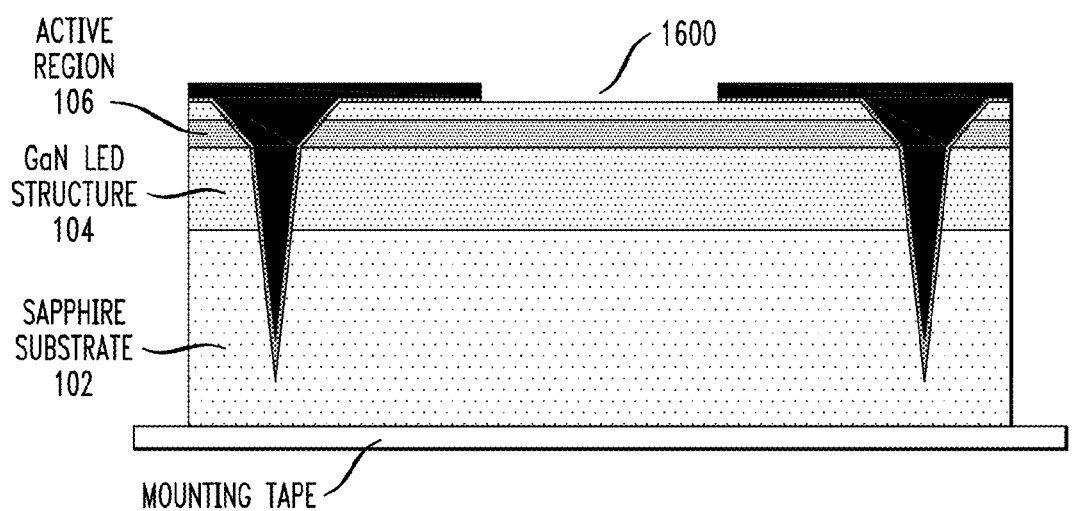
Figure 17:
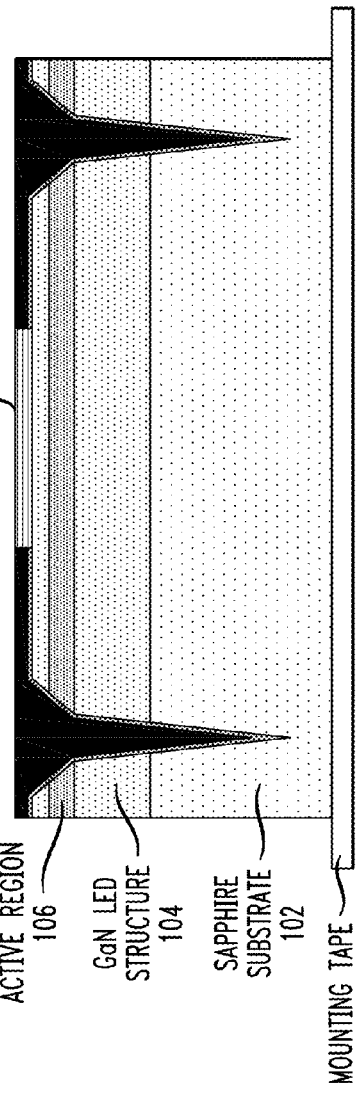

A photoresist layer 1501 is formed over the planarizing dielectric layer 1401 as shown in FIG. 15. The photoresist layer 1501 may be deposited using spray coating techniques, although various other techniques may also be used. Next, the photoresist layer 1501 is exposed and patterned to form an opening 1600. Although FIG. 16 shows an opening 1600 in a single die only, additional openings may be formed in a similar manner in other die of the wafer. P-contact 1710 is formed in the opening 1600 as shown in FIG. 17.

It is important to note that while FIGS. 14-19 show planarizing dielectric layer 1401 substantially filling spaces between sidewalls of adjacent die in the wafer, embodiments are not limited solely to this arrangement. Instead, in some embodiments a reflective material such as a metal layer may be formed between sidewalls of adjacent die in the wafer in place of at least a portion of the planarizing dielectric layer 1401.

Figure 18:
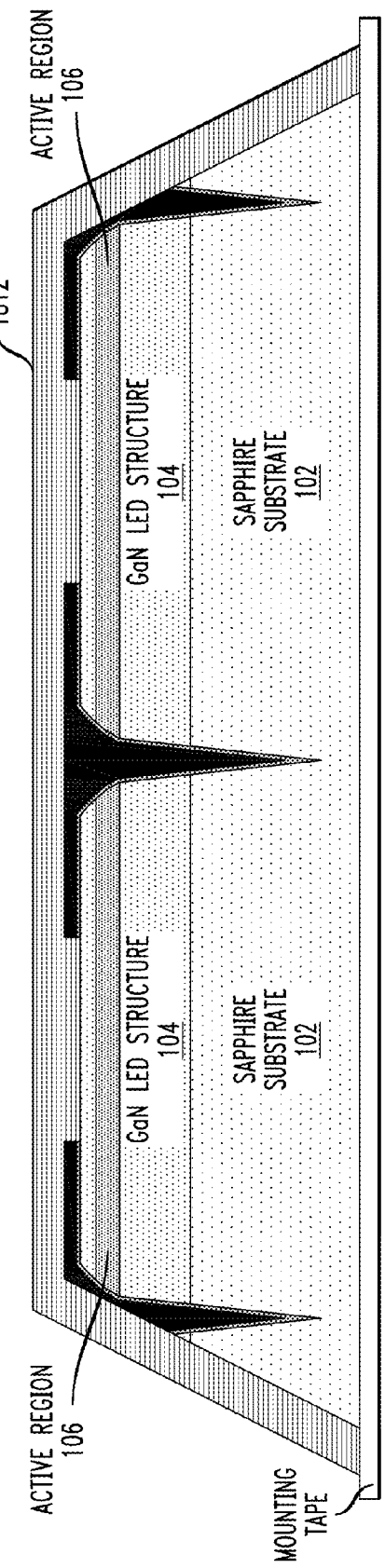

A metal layer 1812 is then formed on the outer sidewalls of the array as shown in FIG. 18. While FIG. 18 shows a cross-sectional view of an array of two die with a contiguous metal layer 1812 formed on outer sidewalls, the planarizing dielectric layer 1401, and p-contacts 1710, embodiments are not limited solely to this arrangement. In other embodiments, arrays may comprise more than two die formed on a single wafer which are grouped into the array with a metal layer 1812 surrounding sidewalls of the array and the planarizing dielectric layer 1401.

Figure 19:
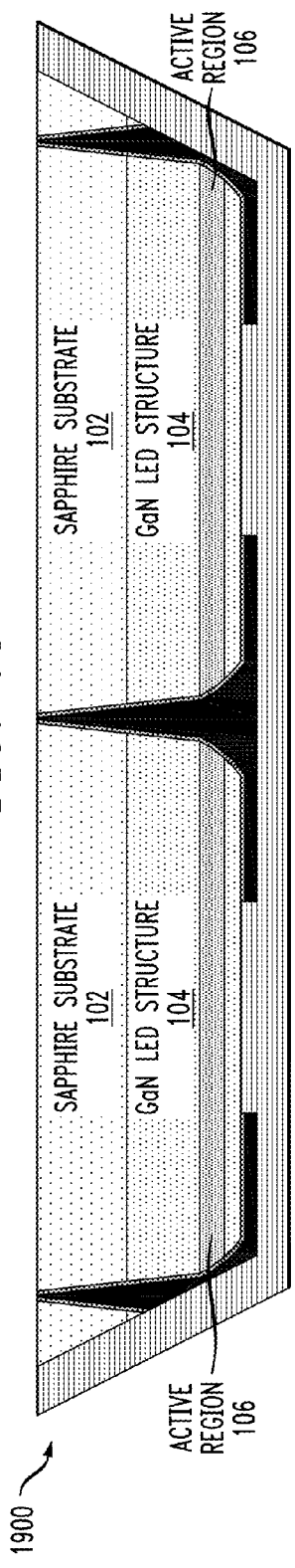

After formation of the metal layer 1812, a tape-to-tape transfer and grinding process may be performed so as to form the array 1900 shown in FIG. 19. The tape-to-tape transfer and grinding process may be performed using techniques similar to those described above with respect to FIGS. 9-11.

Figure 20:
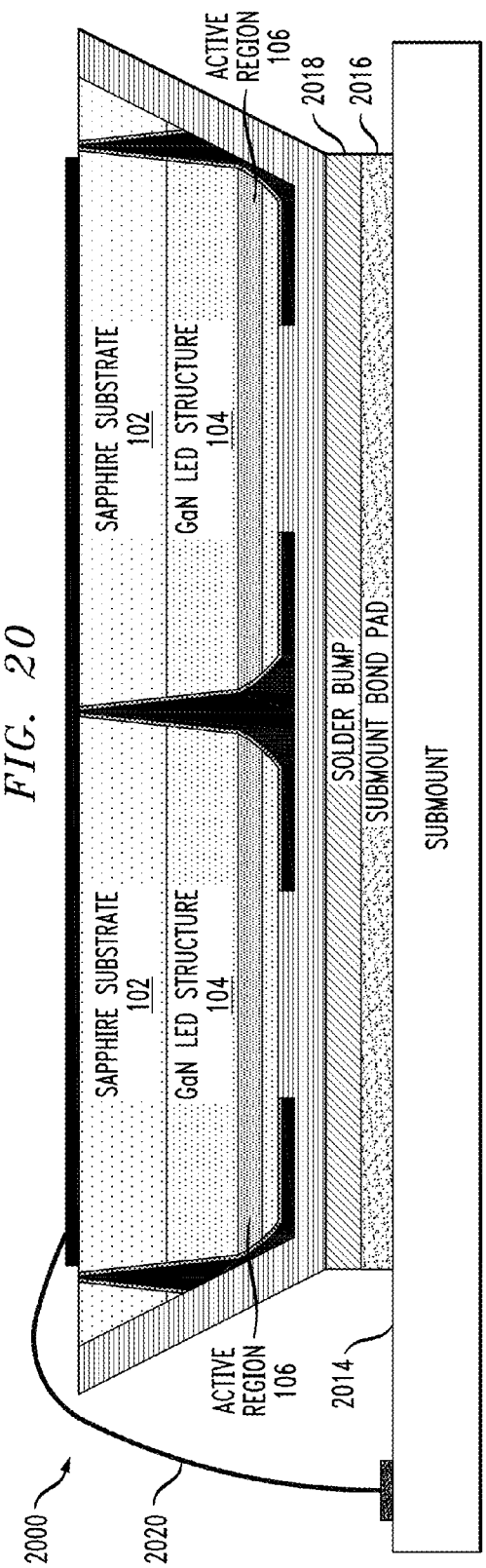
FIG. 20 is a cross-sectional view of an array configuration of light emitting diodes in an illustrative embodiment.

The array 1900 shown in FIG. 19 may be subsequently be picked up and mounted on a submount as shown in FIG. 20 to form LED array 2000. The array is mounted on a solder bump 2018. The solder bump 2018 is mounted on a submount bond pad 2016 arranged on submount 2014. An n-contact 2020 is connected as shown in FIG. 20. Respective vias may be provided in the substrate 102 for connecting the n-contact 2020 to the active semiconductor structure 104 in each of the die in the LED array 2000. It is important to note that while FIG. 20 shows only a single n-contact 2020, embodiments are not limited to this arrangement. For example, each die in the LED array 2020 may have an individually addressable n-contact.

Figure 21:
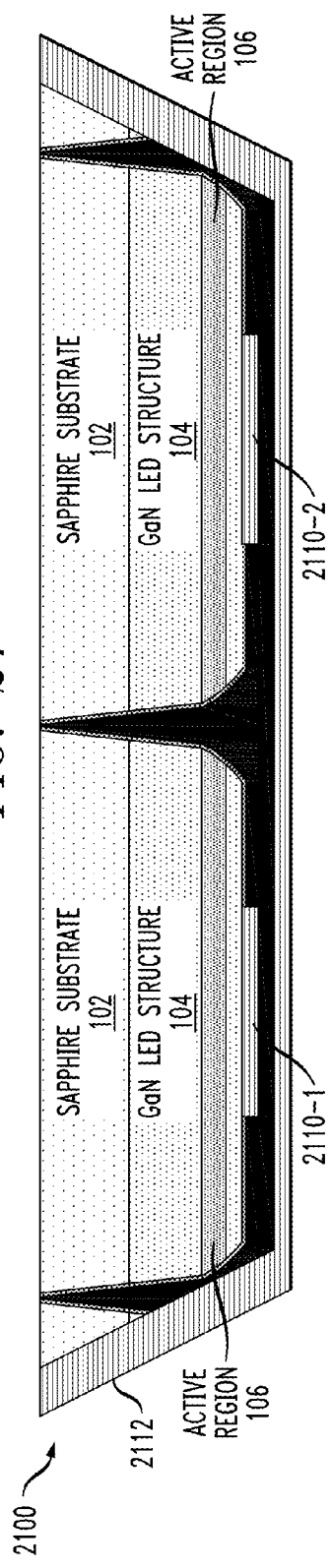
FIG. 21 illustrates a step in a process of forming another array configuration of light emitting diodes in an illustrative embodiment.
Figure 22:
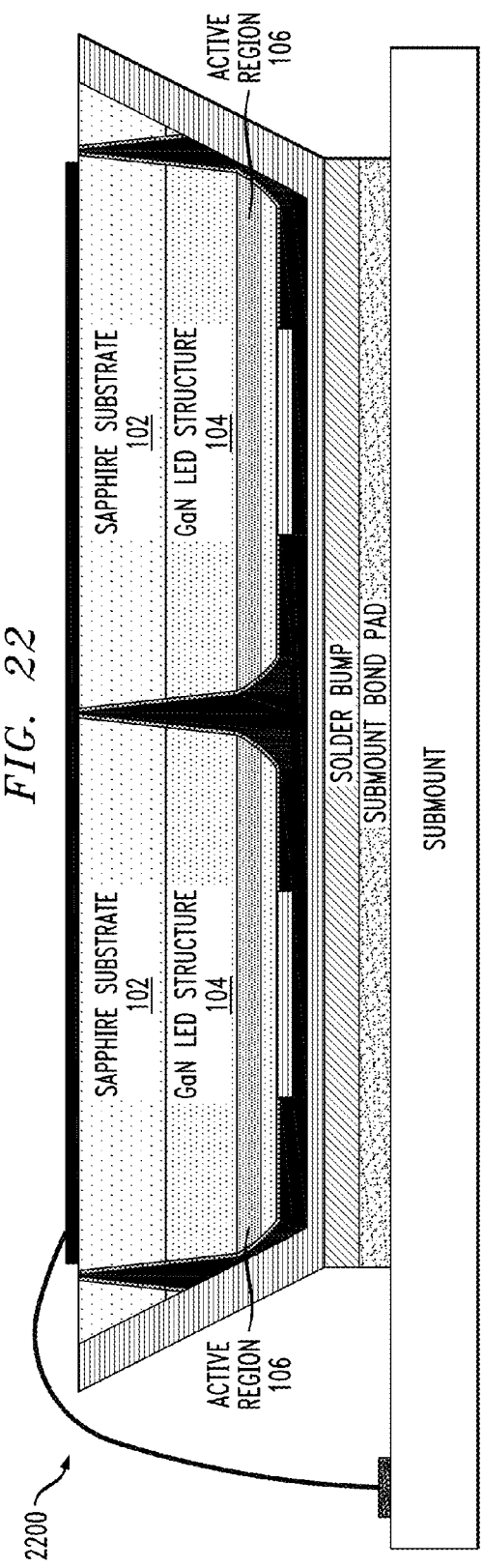
FIG. 22 is a cross-sectional view of another array configuration of light emitting diodes with a common metallized sidewall in an illustrative embodiment.

The p-contacts 1710 for each die in the LED array 2000 are connected to one another via the metal layer 1812. Thus, the individual die in the LED array 2000 are not individually addressable via the respective p-contacts 1710. In other embodiments, the p-contacts for each die in an array may be mirror well separated from the metal layer 1812. FIG. 21 shows a cross-sectional view of such an arrangement. Individual p-contacts 2110-1 and 2110-2 are formed for each die in the array 2100. Each of the p-contacts 2110 may be individually addressable, such that particular ones of the dies in the array 2100 may be individually activated. The array 2100 shown in FIG. 19 may be subsequently be picked up and mounted on a submount as shown in FIG. 22 to form LED array 2200 in a manner similar to that described above with respect to FIG. 20.

In some embodiments, the submount for an array of LEDs may have patterned contacts so that when an LED array is transferred or bonded to the submount portions of the array can be separately contacted.

P-contacts and/or n-contacts of an array of LEDs formed on a single wafer may also be connected in one or more banks of two or more LEDs. Each bank of two or more LEDs may be individually addressable. In some embodiments, the different banks of LEDs may be utilized for providing different light output characteristics such as intensity, pattern, etc. In other embodiments, banks of LEDs may be utilized for redundancy purposes. Some banks may be primary banks where others are redundancy banks. If a primary bank fails, it may be replaced by activating a redundancy bank. Similar redundancy techniques may be utilized for an array of individually addressable LEDs. Particular ones of LEDs in a bank which are shorted may also be eliminated from a bank using isolation or fuse burning techniques.

Figure 23:
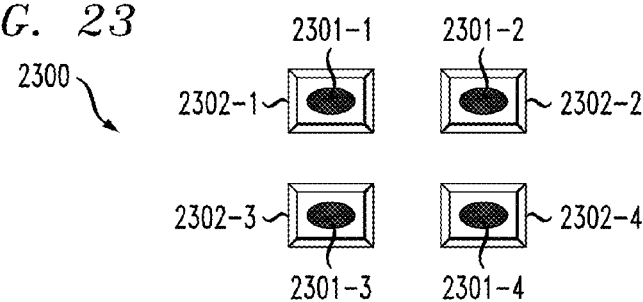
FIG. 23 illustrates an array of light emitting diodes having metallized sidewalls in an illustrative embodiment.

FIG. 23 illustrates an array 2300 of semiconductor optical emitting devices with metallized sidewalls. The semiconductor optical emitting devices of array 2300 include LED 2301-1 with metallized sidewall reflector 2302-1, LED 2301-2 with metallized sidewall reflector 2302-2, LED 2301-3 with metallized sidewall reflector 2302-3, and LED 2301-4 with metallized sidewall reflector 2302-4. Each of the LEDs 2301 and metallized sidewall reflectors 2302 in the array 2300 may be an LED similar to that described above with respect to FIG. 1, FIG. 12 or FIG. 13. It is important to note that while FIG. 23 illustrates an array 2300 of four LEDs 2301 in a square grid layout, embodiments are not limited solely to this arrangement. An array may comprise more or less than four semiconductor optical emitting devices arranged in a variety of shapes. For example, an array may comprise a line of semiconductor optical emitting devices, a circle of semiconductor optical emitting devices, etc.

Figure 24:
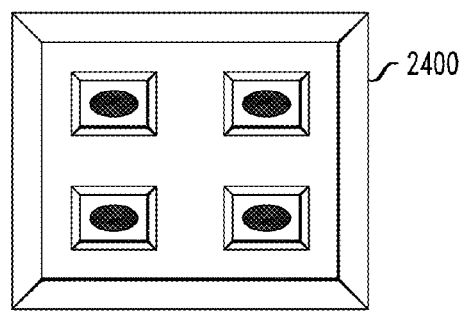
FIG. 24 illustrates the array of light emitting diodes of FIG. 23 with a common array reflector in an illustrative embodiment.

FIG. 24 illustrates the array 2300 of FIG. 23 with a common array reflector 2400 surrounding each of the LEDs 2301 and metallized sidewalls 2302. The common array reflector 2400 can be shaped to direct light emitted from each of the LEDs 2301 in a desired direction.

As mentioned previously, semiconductor optical emitting devices such as those described above can be implemented in the form of integrated circuits. In a given such integrated circuit implementation, identical die are typically formed in a repeated pattern on a surface of a semiconductor wafer. Each die includes circuitry as described herein, and may include other structures or circuits. The individual die are cut or diced from the wafer, then packaged as an integrated circuit. One skilled in the art would know how to dice wafers and package die to produce integrated circuits. Integrated circuits so manufactured are considered embodiments of the invention. In addition, as noted above in some instances a device may be formed wherein two or more individual die on a wafer form an array structure.

Figure 25:
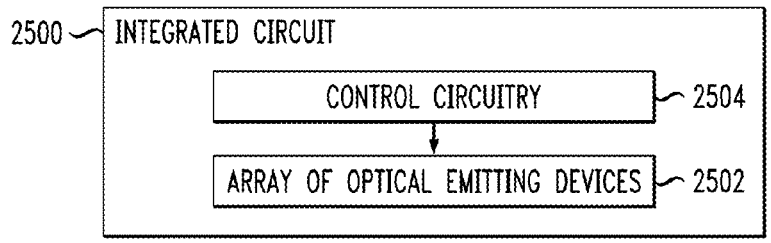
FIG. 25 shows an integrated circuit comprising an array of light emitting diodes and associated control circuitry.

FIG. 25 shows one example of an integrated circuit embodiment of the invention. In this embodiment, an integrated circuit 2500 comprises an array 2502 of LEDs 100 each configured as previously described in conjunction with FIG. 1. Control circuitry 2504 is coupled to the array 2502 of LEDs and is configured to control generation of light by those LEDs. The integrated circuit 2500 may be implemented in a lighting system, an electronic display or another type of system or device.

Figure 26:
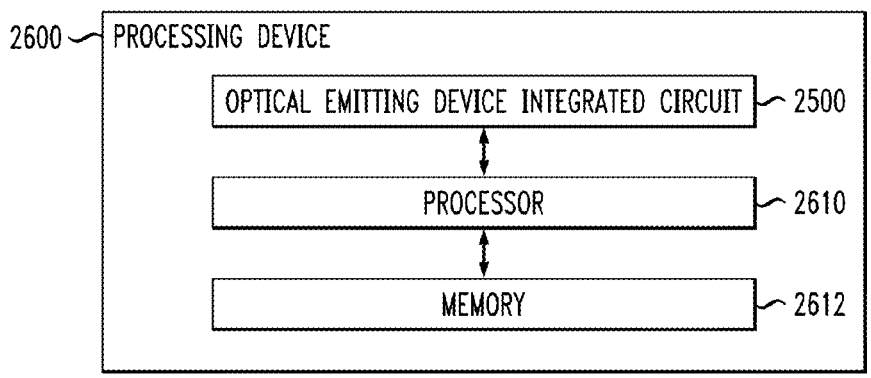
FIG. 26 shows a processing device that incorporates the integrated circuit of FIG. 25.

As another example, a given optical emitting device integrated circuit 2500 may be incorporated into a processing device 2600 as illustrated in FIG. 26. Such a processing device may comprise a laptop or tablet computer, a mobile telephone, an e-reader or another type of processing device that utilizes one or more LED integrated circuits to provide back lighting or for other functions.

In the processing device 2600, the optical emitting device integrated circuit 2500 is coupled to a processor 2610 that controls generation of light by the corresponding array of LEDs.

The processor 2610 may comprise, for example, a microprocessor, an application-specific integrated circuit (ASIC), a field-programmable gate array (FPGA), a central processing unit (CPU), an arithmetic logic unit (ALU), a digital signal processor (DSP), or other similar processing device component, as well as other types and arrangements of circuitry, in any combination.

The processor 2610 is coupled to a memory 2612. The memory 2612 stores software code for execution by the processor 2610 in implementing portions of the functionality of the processing device 2600. A given such memory that stores software code for execution by a corresponding processor is an example of what is more generally referred to herein as a computer-readable medium or other type of computer program product having computer program code embodied therein, and may comprise, for example, electronic memory such as random access memory (RAM) or read-only memory (ROM), magnetic memory, optical memory, or other types of storage devices in any combination. As indicated above, the processor may comprise portions or combinations of a microprocessor, ASIC, FPGA, CPU, ALU, DSP or other circuitry. Such circuitry components utilized to implement the processor may comprise one or more integrated circuits.

The particular configurations of integrated circuit 2500 and processing device 2600 as shown in respective FIGS. 25 and 26 are exemplary only, and in other embodiments integrated circuits and processing devices may include other elements in addition to or in place of those specifically shown, including one or more elements of a type commonly found in conventional implementations of such circuits and devices.

It should again be emphasized that the embodiments of the invention as described herein are intended to be illustrative only. For example, other embodiments of the invention can be implemented utilizing a wide variety of different types and arrangements of semiconductor optical emitting devices, active semiconductor structures, substrates, and sidewall tapering profiles other than those utilized in the particular embodiments described herein. Also, the particular process operations and associated parameters such as materials and thicknesses are exemplary only. In addition, the particular assumptions made herein in the context of describing certain embodiments need not apply in other embodiments. These and numerous other alternative embodiments within the scope of the following claims will be readily apparent to those skilled in the art.

What is claimed is:

1. A semiconductor optical emitting device comprising:
an at least partially transparent substrate comprising a first surface and a second surface;
an active semiconductor structure comprising a first surface, a second surface and at least one sidewall, the first surface of the active semiconductor structure facing the second surface of the substrate;
a dielectric layer surrounding at least a portion of the at least one sidewall of the active semiconductor structure; and
a metal layer surrounding at least an outer portion of the dielectric layer;
wherein the at least one sidewall of the active semiconductor structure is tapered;
wherein a first portion of the at least one sidewall of the active semiconductor structure has a different tapering than a second portion of the at least one sidewall of the active semiconductor structure; and
wherein the active semiconductor structure comprises an active region proximate the second surface of the active semiconductor structure, the first portion of the at least one sidewall of the active semiconductor structure extending from the active region to the second surface of the active semiconductor structure.

2. The device of claim 1, wherein the at least one sidewall of the active semiconductor structure is tapered inwardly from the first surface of the active semiconductor structure.

3. The device of claim 1, wherein the first portion of the at least one sidewall of the active semiconductor structure forms a rounded edge with the second surface of the active semiconductor structure.

4. The device of claim 1, wherein the first portion of the at least one sidewall of the active semiconductor structure and the second portion of the at least one sidewall of the active semiconductor structure comprise respective linear segments, a magnitude of a slope of the linear segment of the first portion of the at least one sidewall of the active semiconductor structure with respect to the second surface of the active semiconductor structure being less than a magnitude of a slope of the linear segment of the second portion of the at least one sidewall of the active semiconductor structure with respect to the second surface of the active semiconductor structure.

5. The device of claim 1, wherein the at least one sidewall is tapered such that the metal layer reflects at least a portion of light generated by the active semiconductor structure towards the first surface of the substrate.

6. The device of claim 1, wherein a taper of the first portion of the at least one sidewall of the active semiconductor structure is configured to reduce a stress concentration at an edge of the active semiconductor structure where the at least one sidewall of the active semiconductor structure meets the second surface of the active semiconductor structure.

7. The device of claim 1, wherein a first portion of the dielectric layer surrounding the first portion of the sidewalls of the active semiconductor structure is thicker than a second portion of the dielectric layer surrounding the second portion of the at least one sidewall of the active semiconductor structure.

8. The device of claim 1, wherein the dielectric layer comprises an at least partially transparent, passivating anti-reflective dielectric layer.

9. The device of claim 1, wherein dielectric layer is configured to prevent surface absorption of light emitted from the active region.

10. The device of claim 1, wherein the device is implemented as one of a semiconductor laser and a light emitting diode.

11. A method comprising:
forming an at least partially transparent substrate comprising a first surface and a second surface;
forming an active semiconductor structure comprising a first surface, a second surface and at least one sidewall, the first surface of the active semiconductor structure facing the second surface of the substrate;
forming a dielectric layer surrounding at least a portion of the at least one sidewall of the active semiconductor structure; and
forming a metal layer surrounding at least an outer portion of the dielectric layer;
wherein the at least one sidewall of the active semiconductor structure is tapered;

wherein a first portion of the at least one sidewall of the active semiconductor structure has a different tapering than a second portion of the at least one sidewall of the active semiconductor structure; and wherein the active semiconductor structure comprises an active region proximate the second surface of the active semiconductor structure, the first portion of the at least one sidewall of the active semiconductor structure extending from the active region to the second surface of the active semiconductor structure.

12. The method of claim 11, wherein a first portion of the dielectric layer surrounding the first portion of the sidewalls of the active semiconductor structure is thicker than a second portion of the dielectric layer surrounding the second portion of the at least one sidewall of the active semiconductor structure.

13. An apparatus comprising:
one or more semiconductor optical emitting devices; and
control circuitry coupled to said one or more semiconductor optical emitting devices for controlling generation of light by said one or more semiconductor optical emitting devices;
at least a given one of the one or more semiconductor optical emitting devices comprising:
an at least partially transparent substrate comprising a first surface and a second surface;
an active semiconductor structure comprising a first surface, a second surface and at least one sidewall, the first surface of the active semiconductor structure facing the second surface of the substrate;
a dielectric layer surrounding at least a portion of the at least one sidewall of the active semiconductor structure; and
a metal layer surrounding at least an outer portion of the dielectric layer;
wherein the at least one sidewall of the active semiconductor structure is tapered;
wherein a first portion of the at least one sidewall of the active semiconductor structure has a different tapering than that of a second portion of the at least one sidewall of the active semiconductor structure; and
wherein the active semiconductor structure comprises an active region proximate the second surface of the active semiconductor structure, the first portion of the at least one sidewall of the active semiconductor structure extending from the active region to the second surface of the active semiconductor structure.

14. The apparatus of claim 13 wherein the one or more semiconductor optical emitting devices and the control circuitry are implemented in one or a lighting system and an electronic display.

15. The apparatus of claim 13, wherein the control circuitry coupled to said one or more semiconductor optical emitting devices for controlling generation of light by said one or more semiconductor optical emitting devices is a component of an integrated circuit.

16. The apparatus of claim 13, wherein a first portion of the dielectric layer surrounding the first portion of the sidewalls of the active semiconductor structure is thicker than a second portion of the dielectric layer surrounding the second portion of the at least one sidewall of the active semiconductor structure.

17. The apparatus of claim 13 wherein the one or more semiconductor optical emitting devices comprise an array of semiconductor optical emitting devices coupled to the control circuitry.

18. The apparatus of claim 17, wherein the array of semiconductor optical emitting devices comprises at least two of the given semiconductor optical emitting devices formed on a single wafer.

19. The apparatus of claim 18, wherein first and second ones of the given semiconductor optical emitting devices comprise respective individual p-contacts separate from the metal layer such that each of the first and second ones of the given semiconductor optical emitting devices is individually activatable by the control circuitry.

20. An apparatus comprising:
one or more semiconductor optical emitting devices; and
control circuitry coupled to said one or more semiconductor optical emitting devices for controlling generation of light by said one or more semiconductor optical emitting devices;
at least a given one of the one or more semiconductor optical emitting devices comprising:
an at least partially transparent substrate comprising a first surface and a second surface;
an active semiconductor structure comprising a first surface, a second surface and at least one sidewall, the first surface of the active semiconductor structure facing the second surface of the substrate;
a dielectric layer surrounding at least a portion of the at least one sidewall of the active semiconductor structure; and
a metal layer surrounding at least an outer portion of the dielectric layer;
wherein the at least one sidewall of the active semiconductor structure is tapered; and
wherein a first portion of the at least one sidewall of the active semiconductor structure has a different tapering than a second portion of the at least one sidewall of the active semiconductor structure;
wherein the one or more semiconductor optical emitting devices comprise an array of semiconductor optical emitting devices coupled to the control circuitry;
wherein the array of semiconductor optical emitting devices comprises at least two of the given semiconductor optical emitting devices formed on a single wafer; and
wherein the metal layer of the at least two given semiconductor optical emitting devices form a single p-contact for the at least two given semiconductor optical emitting devices.

* * * * *